United States Patent [19]
Saruta et al.

[11] Patent Number: 6,035,526
[45] Date of Patent: Mar. 14, 2000

[54] METHOD OF REPAIRING DEFECT AND APPARATUS FOR REPAIRING DEFECT

[75] Inventors: Masahiro Saruta; Akihiro Yamanaka; Hiroshi Deguchi; Takayoshi Ozaki; Kazunari Maeda, all of Shizuoka, Japan

[73] Assignee: NTN Corporation, Osaka, Japan

[21] Appl. No.: 08/972,439

[22] Filed: Nov. 18, 1997

[51] Int. Cl.⁷ .............................. H05K 3/02; B23P 19/00
[52] U.S. Cl. .................... 29/846; 29/745; 219/121.13; 219/121.14; 219/121.17; 427/96
[58] Field of Search ................. 29/825, 846, 402.01, 29/402.03, 402.06, 402.07, 402.08, 402.18, 402.21; 219/121.12, 121.13, 121.16, 121.17, 121.14; 427/96

[56] References Cited

U.S. PATENT DOCUMENTS

| | | | |
|---|---|---|---|
| 4,691,426 | 9/1987 | Roucek et al. | 29/402.18 |
| 4,908,938 | 3/1990 | Thorwarth et al. | 29/846 |
| 4,912,843 | 4/1990 | Dederer | 29/846 |
| 5,099,090 | 3/1992 | Allan et al. | 29/846 X |
| 5,615,387 | 3/1997 | Crockett, Jr. et al. | 29/402.07 X |
| 5,832,595 | 11/1998 | Maruyama et al. | 29/402.01 X |

FOREIGN PATENT DOCUMENTS

| | | | |
|---|---|---|---|
| 1-144697 | 6/1989 | Japan . | |
| 4-246593 | 9/1992 | Japan . | |
| 5-235515 | 9/1993 | Japan | 29/846 |
| 2 067 845 | 7/1981 | United Kingdom | 29/846 |

OTHER PUBLICATIONS

Experimental investigations in laser microsoldering by Hartmann et al Conf. Lasers in Microelectronic Mfg.; Proc SPIE; Intr Soc Opical Engineering v. 1598 pp 175–185, Sep. 10, 1991.

Primary Examiner—Carl J. Arbes
Attorney, Agent, or Firm—McDermott, Will & Emery

[57] ABSTRACT

An apparatus for repairing a defect recognizes a defective portion of a color filter using an image processing mechanism, applies ink to the recognized defective portion of the color filter using a needle for applying ink of an ink application mechanism, hardens the applied ink using an ink hardening mechanism, and removes an unnecessary portion of the applied ink by irradiating laser beam from a laser irradiation mechanism.

28 Claims, 20 Drawing Sheets

LASER BEAM

DEFECTIVE PIXEL

PIXEL

PATTERN RECORDING ②

PATTERN RECORDING ④

PATTERN RECORDING ①
:RECORDING OF A NORMAL PATTERN

PATTERN RECORDING ②-④
:RECORDING OF PERIPHERAL PATTERNS

7

PATTERN RECORDING ①

PATTERN RECORDING ③

FIG.8A RECORDING OF NORMAL PATTERN
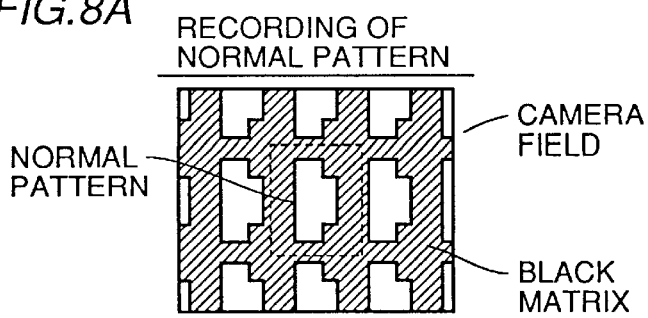
FIG.8B SPECIFYING OF DEFECTIVE PATTERN
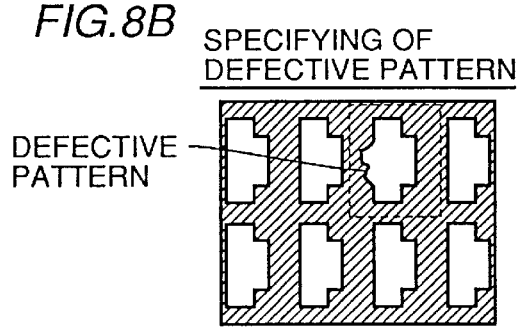
FIG.8C INK APPLICATION
FIG.8C'
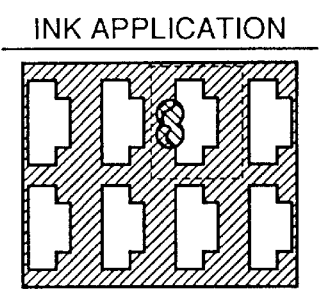 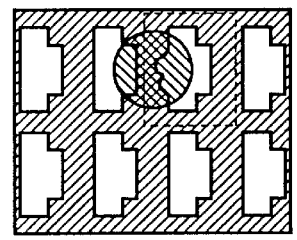
FIG.8D POSITIONING OF LASER IRRADIATION
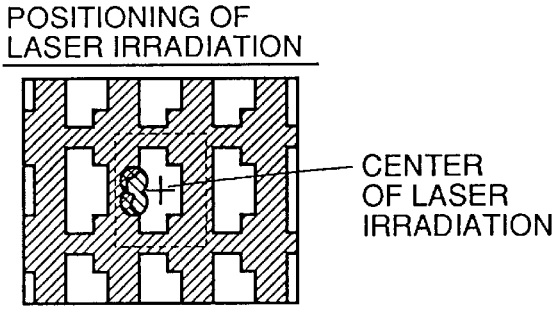
FIG.8E REPAIRING OF DEFECTIVE PORTION
FIG.8E'
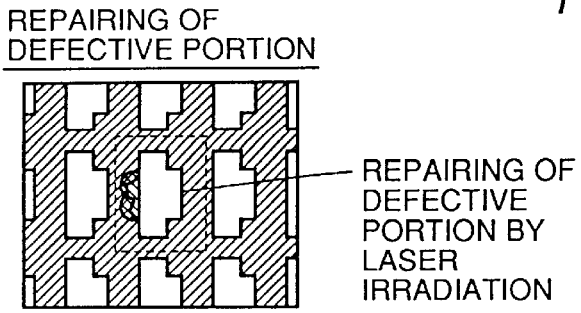 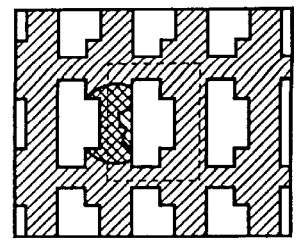

FIG. 10A RECORDING OF NORMAL PATTERN
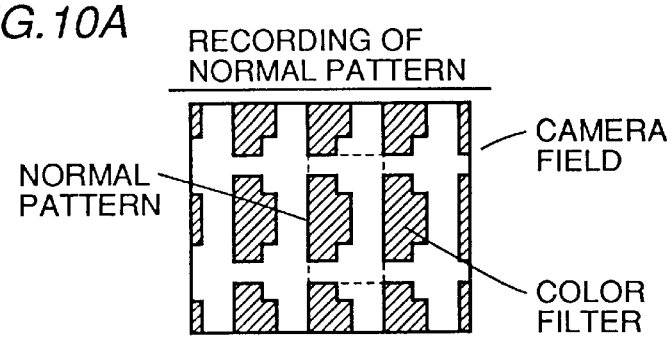
FIG. 10B SPECIFYING OF DEFECTIVE PATTERN
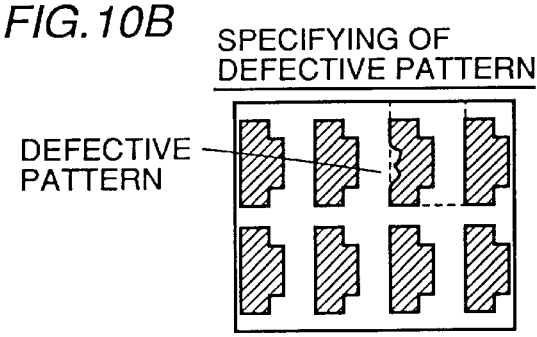
FIG. 10C INK APPLICATION
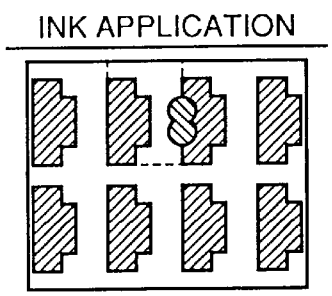
FIG. 10D POSITIONING OF LASER IRRADIATION
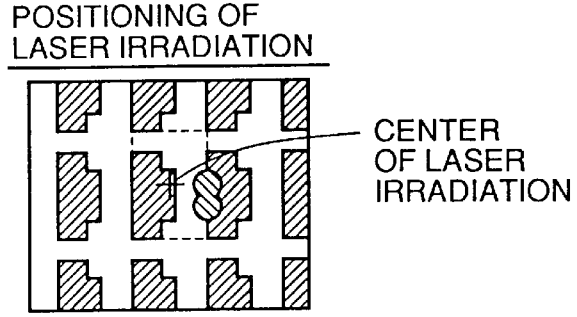
FIG. 10E REPAIRING OF DEFECTIVE PORTION
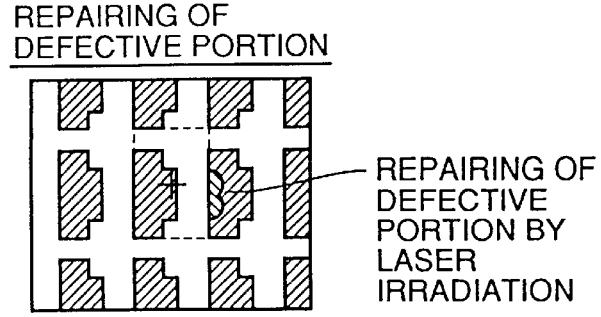

PATTERN SHAPE

FIG. 12A
SPECIFYING OF DEFECTIVE PATTERN AND POSITIONING OF LASER IRRADIATION

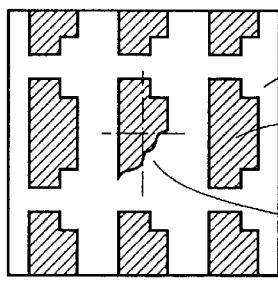

CAMERA FIELD
BLACK MATRIX
NORMAL PATTERN
WHITE DEFECT
BLACK DEFECT

FIG. 12E
SPECIFYING OF DEFECTIVE PATTERN AND POSITIONING OF LASER IRRADIATION

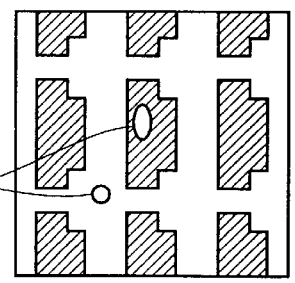

FIG. 12B
REMOVING OF COLOR OF ENTIRE DEFECTIVE PIXEL

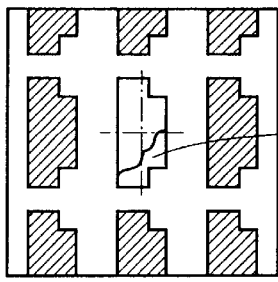

REPAIRED PORTION

FIG. 12F
REMOVING OF COLOR OF ENTIRE DEFECTIVE PIXEL

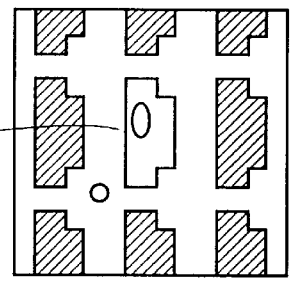

FIG. 12C
INK APPLICATION AND LIGHT IRRADIATION FOR HARDENING FROM BELOW

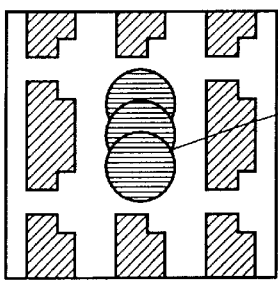

INK APPLICATION
FUNCTION OF MAIN APPARATUS

FIG. 12G
INK APPLICATION AND LIGHT IRRADIATION FOR HARDENING FROM BELOW

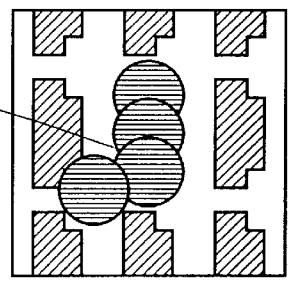

FIG. 12D
REMOVING OF REMAINING INK BY CLEANING
BLACK DEFECT REPAIRING

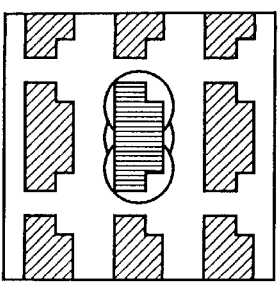

CLEANING UNIT

FIG. 12H
REMOVING OF REMAINING INK BY CLEANING
WHITE DEFECT REPAIRING

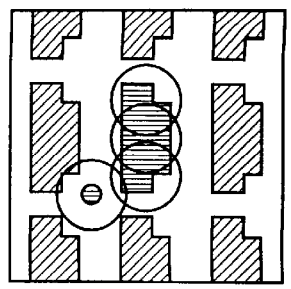

CO2 LASER BEAM

METHOD OF REPAIRING DEFECT AND APPARATUS FOR REPAIRING DEFECT

BACKGROUND OF THE INVENTION

1. Field of the Invention

The present invention relates to a method of repairing a defect and an apparatus for repairing a defect. The invention specifically relates to a method of repairing a defect and an apparatus for repairing a defect by which a defect in a black matrix portion and a colored portion of a color filter as well as a defect in an electrode and a wiring pattern of a liquid crystal substrate are repaired.

2. Description of the Background Art

A color filter as a component of a liquid crystal display has a lattice shape pattern (formed of such material as chromium, chromium oxide and resin) referred to as a black matrix as well as a colored portion. A defect developed when the black matrix is formed includes a black defect and a white defect. If the black matrix extends into a color filter portion (not colored at this stage), the defect is called the black defect. When a part of the black matrix is missing, the defect is called the white defect. In addition, after the color filter portion is colored, if colors of the black matrix and the colored portion are mixed, the defect is called the black defect, and if some color is missing, the defect is called the white defect. Such black defect and white defect are conventionally repaired by an operator watching a camera image, by laser beam for the black defect and by filling the white defect with ink. Such a conventional method requires much labor and time.

Moreover, as the size and definition of the liquid crystal display are increased, the number of its pixels is increased. The rate of occurrence of a defect in an electrode and a wiring pattern of a liquid crystal substrate thus rises. In order to improve the yield in manufacturing the liquid crystal substrate, such a defect must be repaired.

SUMMARY OF THE INVENTION

An object of the present invention is to provide a method of repairing a defect and an apparatus for repairing a defect by which a defect in a color filter as well as a defect in an electrode portion and a wiring pattern of a liquid crystal substrate can be repaired.

The present invention can be briefly described as a method of repairing a defect by which a defective portion of a pattern formed on a substrate is repaired. According to the method as one aspect of the invention, the defective portion is magnified to be displayed, the displayed defective portion is removed as required, and a repairing liquid is applied to the displayed defective portion or the removed portion.

According to another aspect of the invention, an outline of a continuous pattern formed on a substrate is extracted in each inspection area, the maximum value and the minimum value of the outline in either X direction or Y direction are calculated, a defective portion of the continuous pattern is recognized by depending on if those values are respectively in contact with a boundary of the inspection area or not, and ink or conductive paste is applied to the recognized defective portion if the portion is a missing portion.

According to still another aspect of the invention, an outline of a continuous pattern formed on a substrate is extracted in each inspection area, the maximum and the minimum values of the outline in either X direction or Y direction are calculated, a defective portion of the continuous pattern is recognized depending on if those values are respectively in contact with a boundary of the inspection area, and in response to recognition of the defective portion as a short portion, the short portion is removed by laser beam.

Still another aspect of the invention relates to an apparatus for repairing a defect by which a defective portion of a pattern formed on a substrate is repaired. The defective portion is irradiated with laser beam to be removed, a repairing liquid is applied to the defective portion using a needle, and the applied portion is irradiated with light to be hardened.

According to the present invention, the white and black defects can be easily repaired without costing labor and time. In addition, the repairing liquid can be applied by a slight amount, so that a proper amount of the repairing liquid can be applied according to the size of the area.

According to a preferred embodiment of the invention, a repairing liquid is stored in a repairing liquid vessel, the surface of the repairing liquid is detected using a liquid surface detection sensor, and a needle is moved to the detected liquid surface by a repairing liquid application unit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 8A–8E' are provided for describing a method of repairing a defect according to the first embodiment of the invention.

FIGS. 10A–10E are provided for describing a method of repairing a defect according to the second embodiment.

FIGS. 12A–12H are provided for describing a procedure of processing according to the third embodiment of the invention.

DESCRIPTION OF THE PREFERRED EMBODIMENTS

Figure 1:
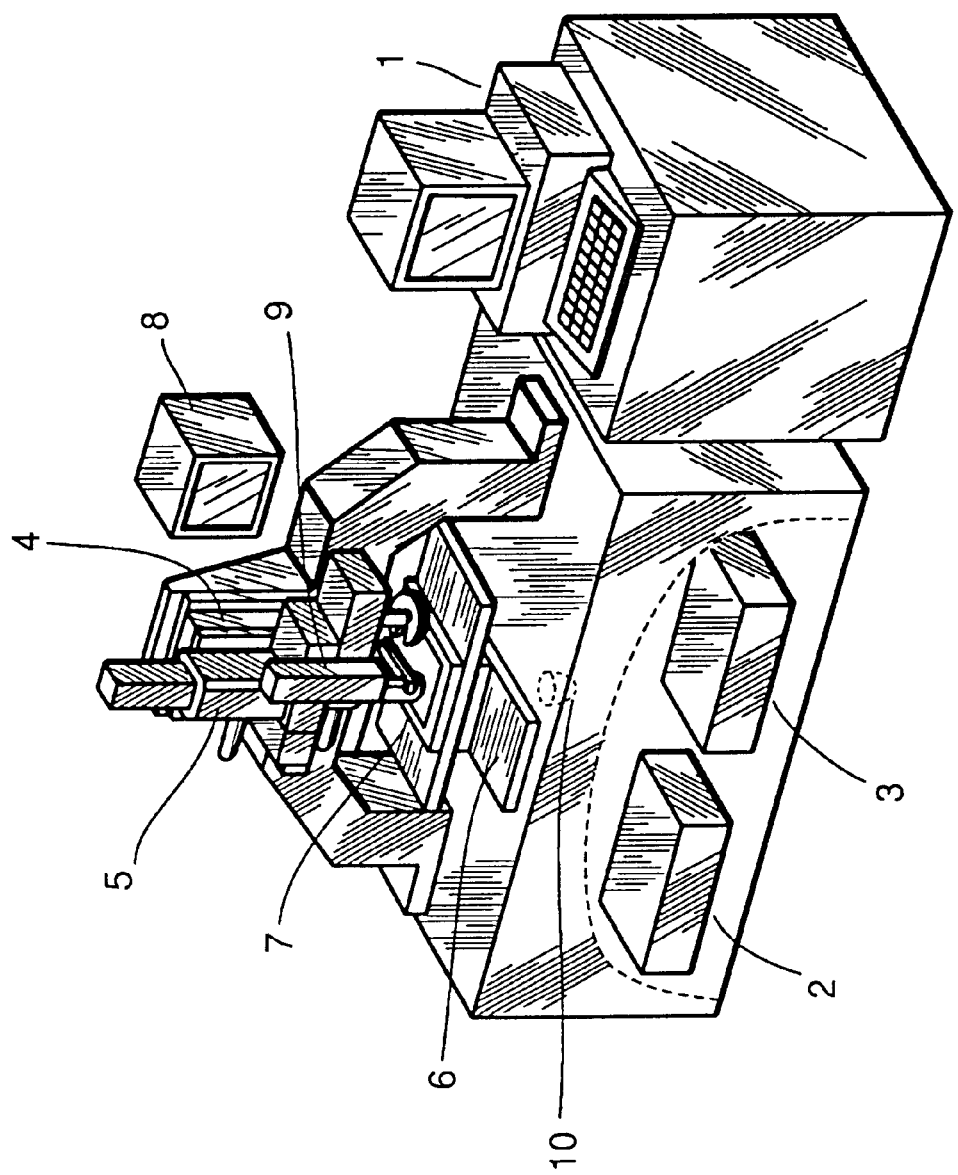
FIG. 1 shows an entire structure of an apparatus for repairing a defect according to a first embodiment of the invention.

FIG. 1 shows an entire structure according to one embodiment of the invention. With reference to FIG. 1, an apparatus for repairing a defect according to this embodiment is generally composed of a laser beam irradiation mechanism 5 formed of a laser and its optical system, an ink application mechanism 9 including ink for filling a white defect and a needle for applying the ink, an ink hardening mechanism 10 formed of a light source for hardening the ink and a collective lens, an image processing mechanism 2 for recognizing a defect, and a host computer 1 which controls the entire apparatus. In addition, an XY table 6 on which work is loaded, a chuck table 7 which holds the work on XY table 6, a Z axis table 4 which drives laser beam irradiation mechanism 5 up and down, a monitor 8 and the like are provided.

Figure 2:
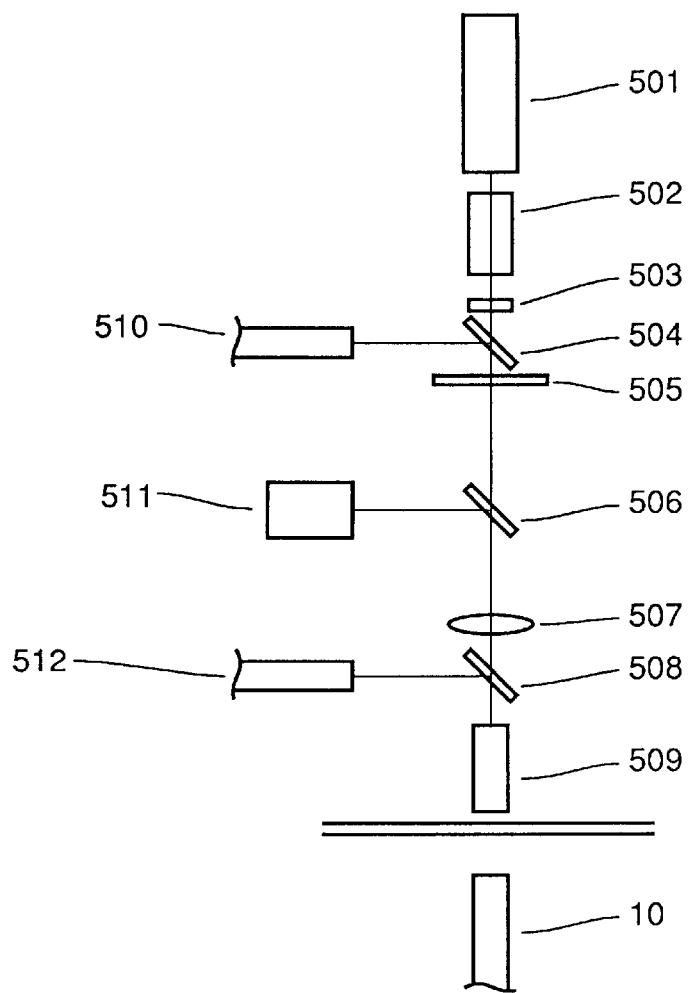
FIG. 2 specifically shows a laser irradiation mechanism and an ink hardening mechanism shown in FIG. 1.

FIG. 2 specifically shows laser beam irradiation mechanism 5 and ink hardening mechanism 10 in FIG. 1. Generally a YAG laser is used as a laser 501. Laser beam from laser 501 is magnified by a beam magnification mechanism 502, and thereafter passed through a filter 503, a beam splitter 504, a slit mechanism 505, a beam splitter 506, an imaging lens 507, a beam splitter 508, and an objective lens 509 to be irradiated on work. Beam magnification mechanism 502 is provided for repairing a defect of a large area with a sufficient laser beam diameter and a uniform distribution of energy intensity. The laser beam diameter is generally approximately 2 mm and the laser beam is magnified using beam magnification mechanism 502 by approximately 3 to 5 times. By magnifying the laser beam, the difference of energy between the center of the beam and its peripheral portion is reduced to fulfill the function above. A CCD camera 511 is provided in relation to beam splitter 506 for imaging light reflected from the work.

Figure 3:
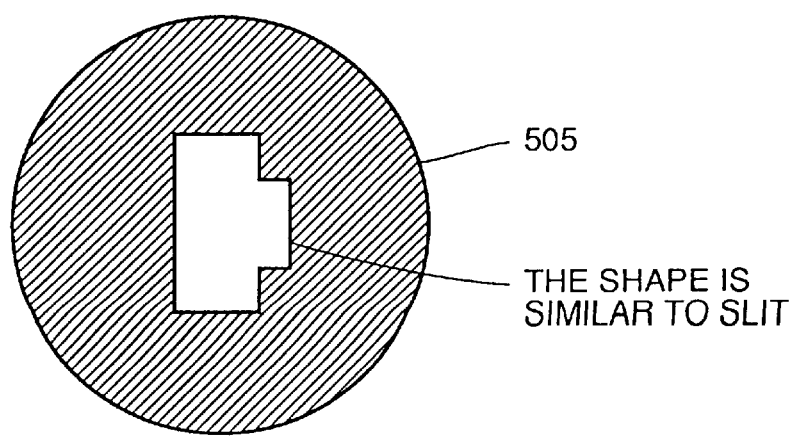
FIG. 3 shows one example of a slit shape used in a slit mechanism shown in FIG. 2.

FIG. 3 shows one example of the slit mechanism. The shape of a pixel of the black matrix is not necessarily rectangular, and to repair the non-rectangular shape by combining rectangular shapes is difficult considering required time and precision. Using a fixed slit which is similar to a pixel in shape (a slit larger than a pixel by 20 times if a 20× objective lens is used for example), a defect can be repaired by irradiating laser beam once, so that reduction of the time for repairing and required precision can be achieved.

Figure 4:
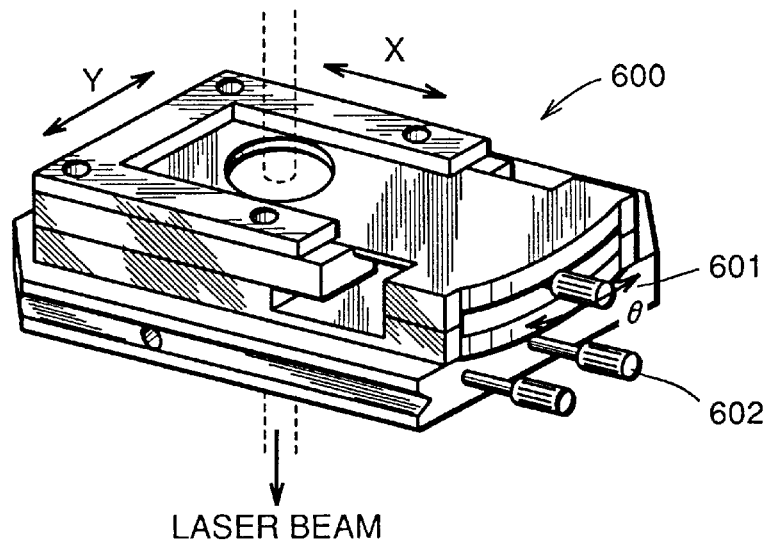
FIG. 4 shows one example of a slit attachment mechanism.

FIG. 4 shows a mechanism of attaching a slit. A slit attachment mechanism 600 is provided for attaching slit mechanism 505 shown in FIG. 3. Slit attachment mechanism 600 can be moved in X-Y-θ direction by manually operating an adjustment knob for moving in θ direction 601 and an adjustment knob for moving in X direction 602. Such X-Y-θ movement mechanism may be manual or automatic. In addition, the mechanism may be a rotating type or a type of swaying from side to side if a plurality of slits are required.

The kind of a light source for hardening the ink and a location thereof are conveniently selected according to the kind of the ink and need of hardening from either front or back side of the work. If the ink is an ultraviolet-curing resin, an ultraviolet radiation source is used. If the ink is the thermosetting resin, a visible light source or an infrared radiation source may be used. If light is irradiated from under the work, the light source may be located at the position of light source for hardening A in FIG. 2, and if light is irradiated from above the work, the light source may be located at either the position of light source for hardening B or that of light source for hardening C in FIG. 2. If the B position is selected, the light source functions for recognizing the shape of the slit and can harden only the portion of the slit shape. In addition to the resin described above, metallic paste (gold, silver, ITO or the like) is used as the ink. In order to harden or calcine such material, laser (YAG, $CO_2$ laser or the like) having wavelength of 500 nm or more is utilized.

Figure 5:
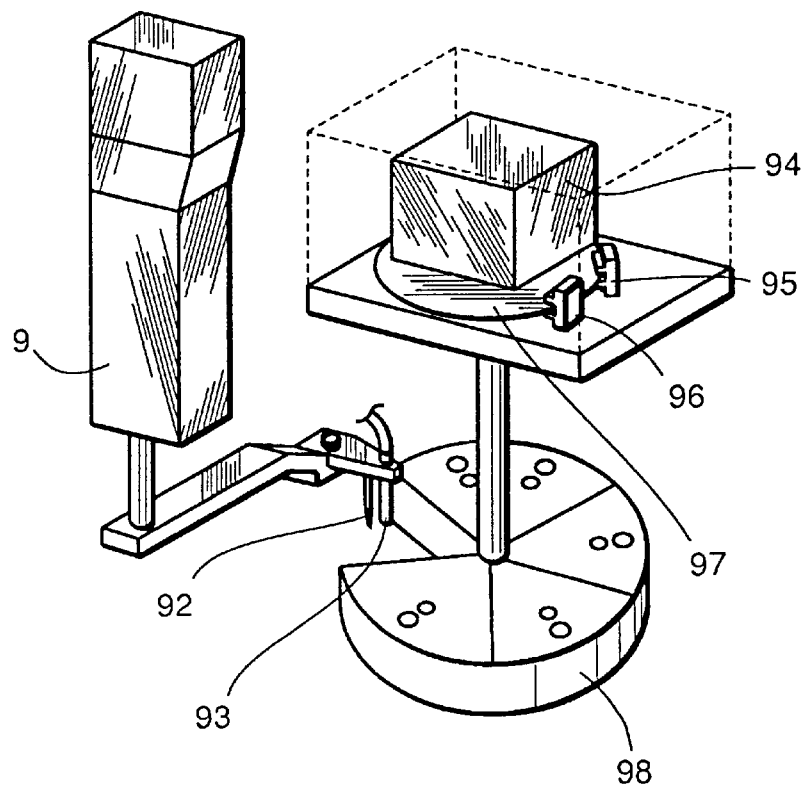
FIG. 5 shows one example of an ink application mechanism.

FIG. 5 shows details of an ink application mechanism. Referring to FIG. 5, a positioning cylinder for ink application 91 and a motor for ink tank index 94 are provided such that they move with Z axis. An ink application needle 92 and an ink surface detection sensor 93 are attached to the leading end of positioning cylinder for ink application 91, and an ink tank table 98 on which a plurality of ink tanks are loaded is connected to the leading end of motor for ink tank index 94. In the proximity of motor for ink tank index 94, a sensor for ink tank index 95 for detecting the position of ink tank by an ink tank index plate 97 rotating according to the rotation of the motor, as well as a sensor for detecting return of an ink tank to its original position 96 for detecting the returning of the ink tank to its original position are provided.

By processing the tip of ink application needle 92 into a planar shape, and by controlling such that the tip of ink application needle 92 is always located at a constant depth from the ink surface, a slight and constant amount of ink can be applied to a defective portion without fail; Ink of various colors as RGB and black as well as solvent for preventing fixing of ink are conveniently injected into the plurality of ink tanks.

Figure 6:
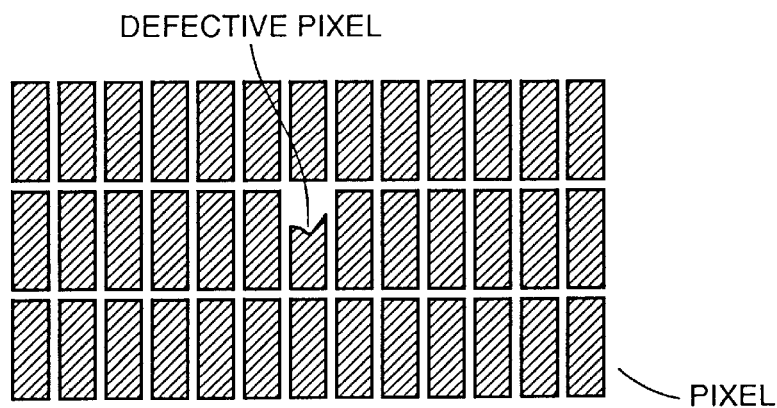
FIG. 6 shows one example of a pixel pattern to be repaired.
Figure 7:
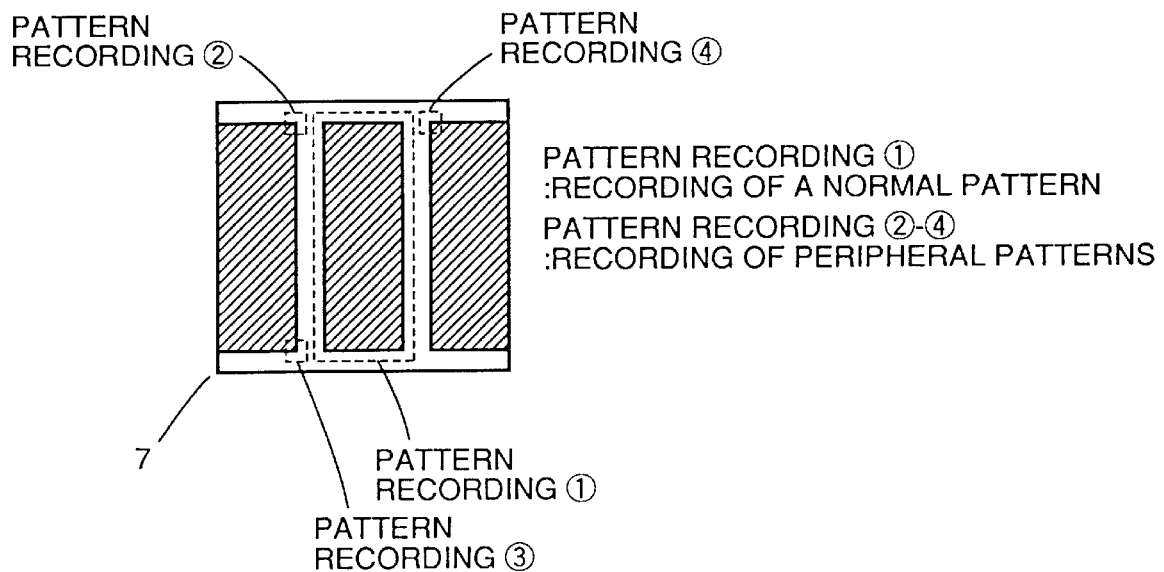
FIG. 7 is provided for describing a method of recording a pattern matching data.

FIGS. 6 and 7 are provided for describing a method of specifying a defective pixel by image processing mechanism 2 showing in FIG. 1. Image processing mechanism 2 specifies a defective pixel by pattern matching, and outputs coordinates for positioning. FIG. 6 shows one example of a pixel pattern to be repaired, and FIG. 7 shows a method of recording pattern matching data. Pattern ① shown in FIG. 7 is first recorded as a normal pixel. Pattern matching is carried out for a plurality of pixels shown in FIG. 6 with the recorded pattern ① as a reference. A pattern having a correlation value of a threshold value or less is recognized as a defect. In order to position a defective pixel, the periodicity of a pixel to be positioned is utilized. Specifically, peripheral patterns of the pixel such as patterns ②, ③ and ④ shown in FIG. 7 are recorded in advance, and the positioning is achieved using relative distance between position coordinates of peripheral patterns and defective coordinates.

Figure 9:
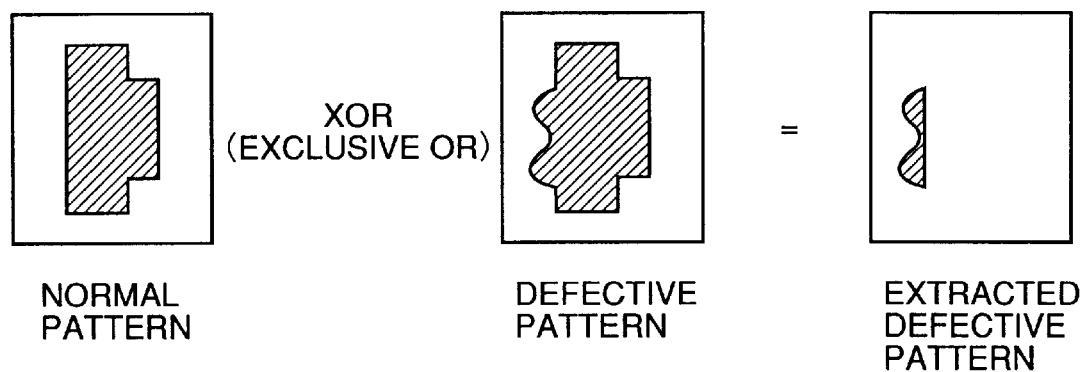
FIG. 9 is provided for describing a method of extracting a defective portion.

FIGS. 8A–8E' show a method of repairing a white defect of a black matrix by image processing and its flow. FIG. 9 shows a method of extracting a defective portion.

First, XY table 6 is moved based on position data of a defective pixel from an inspection apparatus of the previous stage. In this state, a recorded pattern of a normal pixel shown in FIG. 8A is searched to recognize a defective pixel. If a defective pixel cannot be recognized within a field of view of CCD camera 511 shown in FIG. 2, searching in side to side direction as well as up and down direction is employed to detect a defective pixel shown in FIG. 8B. If a defective pixel is recognized, information on an area shown by the broken line in FIG. 8B is stored, and the information is compared with information on a normal pixel within the same area by, for example, using exclusive OR. Accordingly, the size of the area and position of a defect (white defect in this case) can be calculated.

Next, ink application mechanism 9 is driven to move ink application needle 92 to the position of the defect, and ink tank index motor 94 is driven to rotate ink tank table 98. After an appropriate tank is selected, ink application positioning cylinder 91 is moved up and down to attach ink to ink application needle 92, and an appropriate amount of ink is applied to a color filter. FIG. 8C shows a state in which ink is applied to two positions. In order to dry the ink, ultraviolet or other light is irradiated thereon.

Since coordinates of the defective position can be recognized at the stage shown by FIG. 8B, the position is moved to the center of laser irradiation as shown by FIG. 8D. As shown by FIG. 8E, the laser irradiation allows unnecessary ink to be removed and the defect is repaired. If the region where ink is applied could be large as shown by FIG. 8C' due to the viscosity of ink or the like, pattern matching by the image processing is again employed at this stage and an enlarged defective pixel is confirmed. Unnecessary ink can be removed as shown by FIG. 8E' by carrying out the laser irradiation two times according to the enlarged pixel.

Although a method of repairing a white defect is heretofore described, its processes are similar to those for repairing a black defect except for a process of applying ink, and the method is also applicable to repairing of a black defect.

In addition, although the description above is concerned with a case in which a white defect is present at the black matrix portion, there are various methods of manufacturing a color filter and the black matrix may be formed at the last stage. Applicability of the method above to this case is described below.

Figure 11:
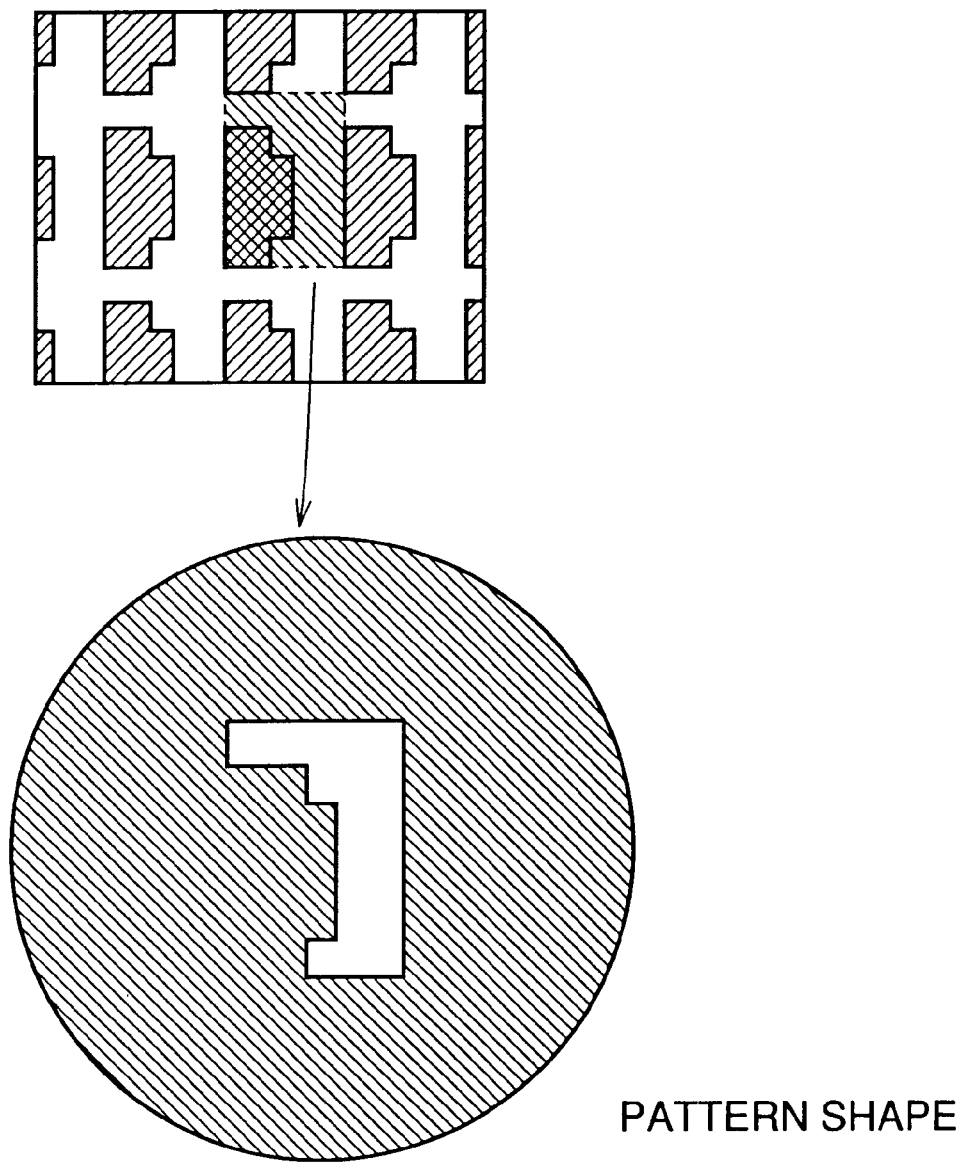
FIG. 11 shows one example of a slit shape according to the second embodiment.

FIGS. 10A–10E show the second embodiment in which a colored portion of a color filter is indicated by oblique lines and a portion to become a black matrix in the later process is shown by the white portion (nothing is applied to this portion at this point). Description of processes up to the laser irradiation is similar to that given with reference to FIGS. 8A–E. Specifically, a portion where color is missing as shown by FIG. 10B is recognized as a defective pattern, ink having a color corresponding to that of the missing portion is applied thereto, the ink is hardened and thereafter corrected by laser. The difference is the shape of the slit as shown by FIG. 11 which is reversed compared with FIG. 3 since laser beam is irradiated onto the black matrix portion.

FIGS. 12A–12H are provided for describing a procedure of processing according to the third embodiment of the invention. According to the embodiment above, description of repairing a black matrix is given, however, according to the third embodiment, a defective portion developed after the black matrix and colored portion are formed is repaired. FIGS. 12A–12D show a procedure of repairing a black defect, and FIGS. 12E–H show a procedure of repairing a white defect.

Figure 13:
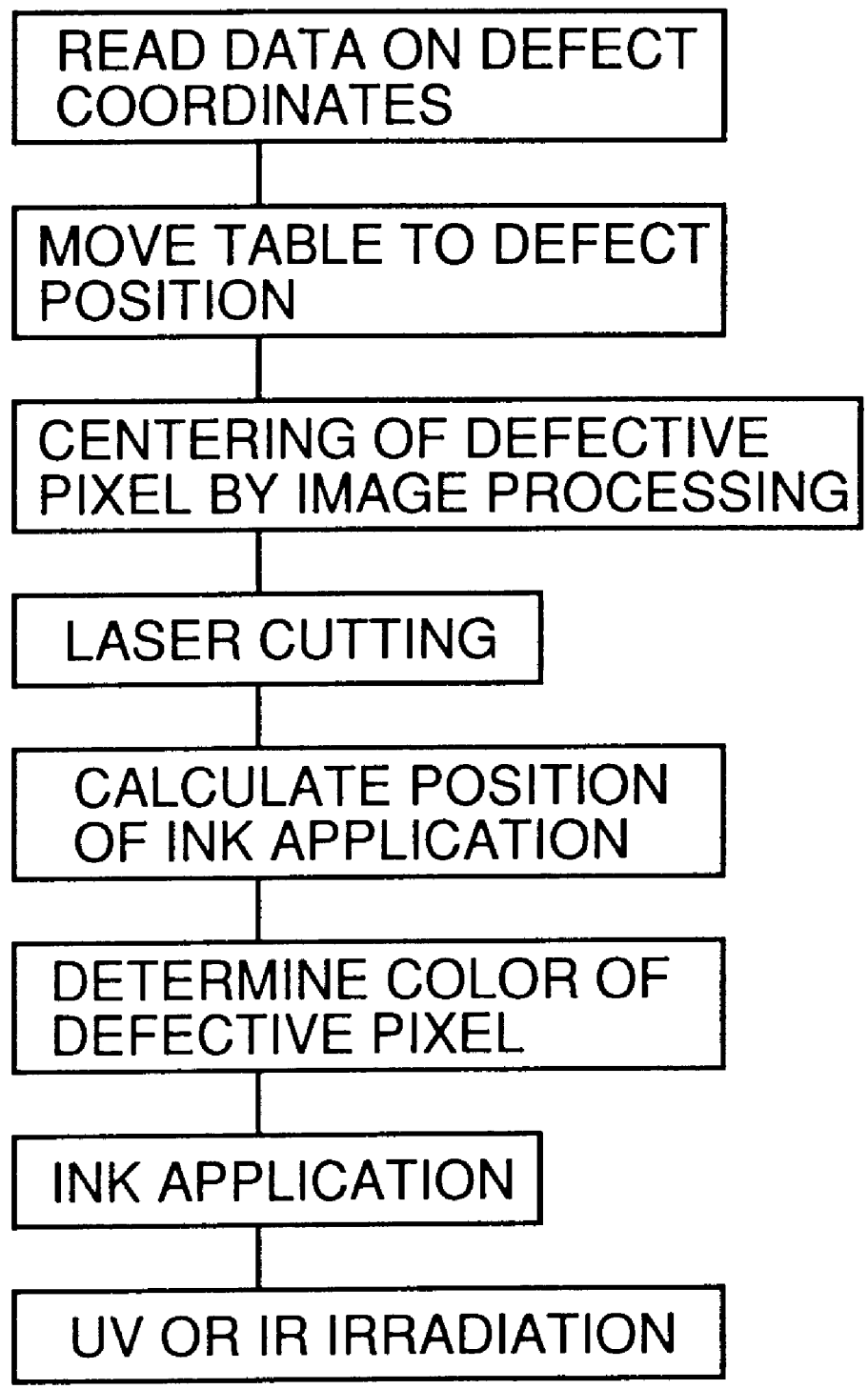
FIG. 13 is a flow chart for describing an operation according to the third embodiment.

FIG. 13 is a flow chart for describing an operation according to the third embodiment. Referring to FIGS. 1, 12 and 13, an operation according to the third embodiment is described. First, recognition of a defect and repairing of the defect within a field of view of a camera are carried out based on data of the position of the defect supplied from an inspection apparatus in the previous stage. Specifically, based on data from the inspection apparatus of the previous stage, X-Y table 6 is moved to the position of the defect. Pattern matching with a normal pixel recorded in advance is performed by image processing mechanism 2, a defective pixel within the field of view is detected and the defective pixel is centered at a position for repairing a defect as shown by FIGS. 12A and 12E. Next as shown by FIGS. 12B and 12F, the entire pixel is cut altogether using a slit (mask) similar to the shape of the pixel. This method enables reduction of repairing time compared with the method by which a very small area is cut by laser according to the shape of the defect. However, if there is a white defect in the black matrix portion as shown by FIG. 12F, the defective portion is repaired as per its shape.

Next the color of the defective pixel is determined from peripheral pixels by image processing mechanism 2. As shown by FIGS. 12C and 12G, ink of various colors such as R, G, B and black is applied to a position for ink application obtained by calculation. The applied ink is hardened by ink hardening mechanism 10 which irradiates light from below. If a plurality of defects exist in the same substrate, the operation of repairing described above is repeated. Remaining ink is thereafter removed by cleaning as shown by FIGS. 12D and 12H.

YAG laser is suitable as the laser beam above. Processing by fundamental wave (1064 nm) is fusing by heat. On the other hand, processing by higher harmonics is a non-heat processing such as cutting of intermolecular bonding or liberating of atoms. Preferably, a pattern of a black matrix formed of metallic material such as Cr is removed using the fundamental wave, and a pattern formed of polymer material such as resin type material (for example, resin black matrix and colored portion) is removed using the second harmonics (532 nm), the third harmonics (355 nm), the fourth harmonics (266 nm), and the like. In order to achieve this, each wavelength of the laser beam may be employed to remove the pattern according to the use. For example, a single laser which outputs two kinds of wavelengths may be loaded such that it outputs the fundamental wave and the second harmonics or the second harmonics and the third harmonics.

According to this embodiment of the invention, as described above, a defective portion of a color filter is recognized by image processing, the recognized defect is removed as required, and ink is applied to the defective portion or the removed portion to be hardened. As a result, repairing of white and black defects is possible without costing labor and time. Further, since ink can be applied by a slight amount, a proper amount of ink can be applied according to the size of the area. A defective portion can be repaired after a black matrix is formed. In addition, a defective portion can be repaired even if only a colored portion is formed.

Figure 14:
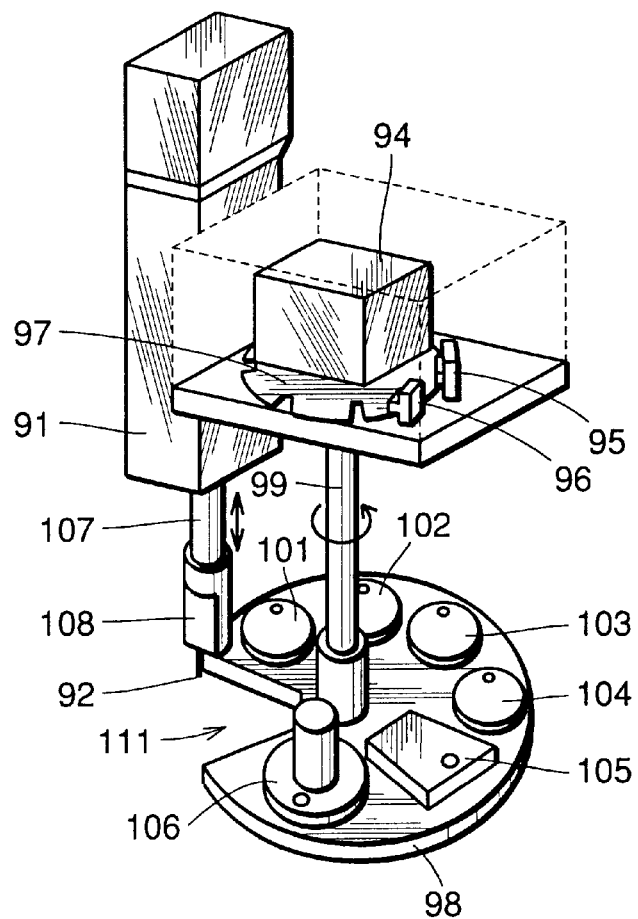
FIG. 14 illustrates an ink application mechanism according to the fourth embodiment of the invention.
Figure 15:
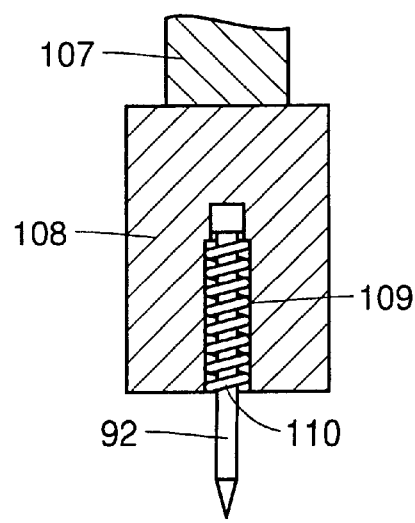
FIG. 15 is a cross sectional view showing a structure of a holding mechanism shown in FIG. 14.

FIG. 14 shows an ink application mechanism according to the fourth embodiment, and FIG. 15 is a cross sectional view illustrating a structure of a holding mechanism shown in FIG. 14.

Referring to FIG. 14, the ink application mechanism includes a needle 92 for applying ink, and an actuator 91 for positioning in order to drive needle 92 in the vertical direction. Needle 92 is placed at the leading end portion of a drive axis 107 of actuator 91 via a holding member 108. Referring to FIG. 15, a vertical hole 109 is provided at a plane of the lower end of holding member 108, and the upper end portion of needle 92 is inserted into hole 109 with a spring 110 which enables the needle to move up and down.

Further, the ink application mechanism shown in FIG. 14 includes a horizontally arranged rotating table 98, a plurality of ink tanks 101–104 sequentially arranged on rotating table 98 in the circumferential direction, a cleaning unit 106, and an air purging unit 105. An axis of rotation 99 is placed at the center of rotating table 98 in a standing state. A notch 111 is formed at rotating table 98 for passing needle 92 when ink is applied. Ink of various colors such as RGB and black and solvent for preventing fixing of ink are conveniently injected into ink tanks 101–104 respectively.

Figure 16:
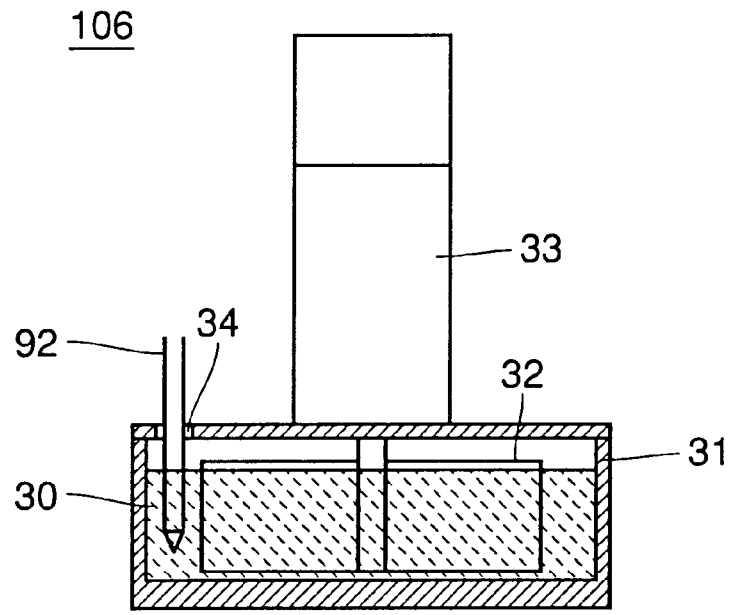
FIG. 16 is a cross sectional front view of a cleaning apparatus shown in FIG. 14.
Figure 17:
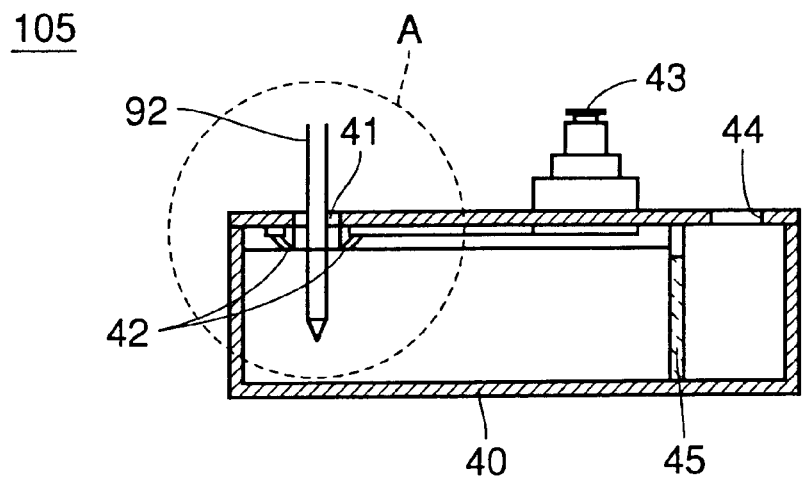
FIG. 17 is a cross sectional front view showing a structure of an air purging apparatus in FIG. 14.

FIG. 16 is a partially omitted front view of the cleaning unit shown in FIG. 14, and FIG. 17 is a partially omitted front view of a structure of the air purging unit.

Referring to FIG. 16, cleaning unit 106 includes a cleaning tank 31 for storing a cleaning liquid 30, a rotating spatula 32 for enhancing the cleaning effect by stirring cleaning liquid 30 in cleaning tank 31, and a motor 33 for driving rotating spatula 32. The upper surface of cleaning tank 31 has a small hole 34 formed therein. Needle 92 is immersed in cleaning liquid 30 via small hole 34 to be cleaned.

Figure 18:
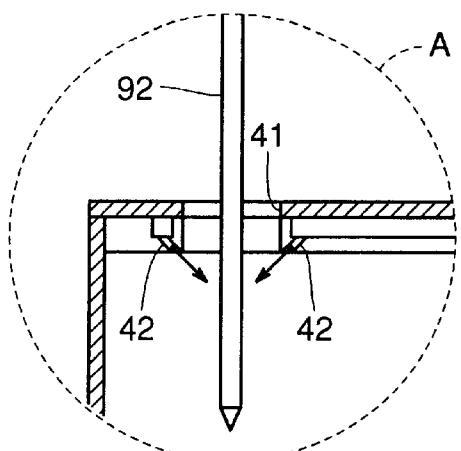
FIG. 18 illustrates the enlarged A portion shown in FIG. 17.

Referring to FIG. 17, air purging unit 105 includes a pressure-resistant case 40. Case 40 includes a small hole 41 into which needle 92 is inserted, a plurality of air jet outlets 42 for spouting air, an air discharge vent 44 for discharging the spouted air to the outside, and a filter 45 for removing mist or the like of cleaning liquid 30 from the spouted air. Needle 92 is inserted into case 40 via small hole 41. Air supplied from an air supply opening 43 is spouted toward needle 92 in various directions via the plurality of air jet outlets 42 as shown in FIG. 18. Accordingly, cleaning liquid 30 or the like attached to needle 92 is blown off. The spouted air is discharged to the outside via air discharge vent 44 after the mist of cleaning liquid 30 is removed by filter 45.

In addition, the ink application mechanism includes, as shown by FIG. 5, a motor for index 94 for rotating an axis of rotation 99 of rotating table 98, an index plate 97 which rotates with axis of rotation 99, sensor for index 95 for detecting the position of rotation of rotating table 98, and sensor for detecting returning to original position 96 for detecting returning of the position of rotation of rotating table 98 to its original position by index plate 97. Motor 94 is controlled based on outputs from sensors 95 and 96. Motor 94 rotates rotating table 98 to position any of notch 111, ink tanks 101–104, cleaning unit 106 and air purging unit 105 under needle 92.

Positioning actuator 91 and index motor 94 are fixed at a Z-axis table (not shown), and a color filter to be repaired is placed on an XY table (not shown) located below needle 92.

An operation of the apparatus for repairing a defect is described. First the XY table and Z axis table (not shown) are driven to place needle 92 at a prescribed position above a defective portion of a color filter. Next rotating table 98 is rotated to locate ink tanks 101–104 in which ink to be applied to the defective portion is stored at a position under needle 92. Actuator 91 causes needle 92 to move up and down and the ink is attached to the tip of needle 92.

Rotating table 98 is next rotated to place notch 111 at a position under needle 92, and actuator 91 causes needle 92 to move down to allow the tip of needle 92 to be in contact with the defective portion of the color filter, and the ink is applied to the defective portion. At this time, the impact force generated between the tip of needle 92 and the color filter is absorbed by spring 110 shown in FIG. 15 so that damage to needle 92 and the color filter is prevented.

After the ink is applied, needle 92 is moved back to its original position by actuator 91. Rotating table 98 is rotated to place cleaning unit 106 at a position under needle 92. Next needle 92 is moved down by actuator 91 and the tip of needle 92 is immersed into cleaning liquid 30 via small hole 34 shown in FIG. 16. Needle 92 is cleaned with cleaning liquid 30 stirred using rotating spatula 32.

After the cleaning, needle 92 is returned to its original position by actuator 91, and rotating table 98 is rotated to place air purging unit 105 at a position under needle 92. Needle 92 is moved downward by actuator 91, and the tip of needle 92 is inserted into small hole 41 shown in FIG. 17. Air from air jet outlet 42 is spouted to the tip of needle 92 and cleaning liquid 30 or the like attached to needle 92 is removed. Accordingly, needle 92 is returned to its original position by actuator 91 after the air purging, and repairing of a defect is completed.

According to this embodiment, air purging unit 105 for removing cleaning liquid 30 attached to needle 92 is provided so that no dirt generated by drying of cleaning liquid 30 remains on needle 92 even if cleaning liquid becomes dirty. In addition, reduction of the cost of the apparatus as well as simplification of the maintenance can be achieved since simple cleaning unit 105 in which cleaning liquid 30 is stirred by rotating spatula 32 instead of the conventional ultrasonic cleaning unit is used.

According to the embodiment above, although the invention is applied to an apparatus by which a color filter is repaired using ink applied thereto, the applied material may be photosensitive resist or metallic paste (for example, gold, silver, ITO, palladium and the like) other than the ink. Moreover, anything having a defect such as a substrate having a pattern printed, PDP (Plasma Display Panel) for example, other than the color filter may be repaired.

According to the embodiment described above, the impact force generated when needle 92 and the color filter are caused to be in contact with each other is reduced by spring 110 attached to needle 92 as shown in FIG. 15. However, according to this method, if the amount of the descent of needle 92 varies, the amount of contraction of spring 110 attached to needle 92 varies, so that the force of contact acting between needle 92 and the color filter changes. As a result, the state of application of the ink could change. An embodiment for solving such a problem is hereinafter described.

Figure 19:
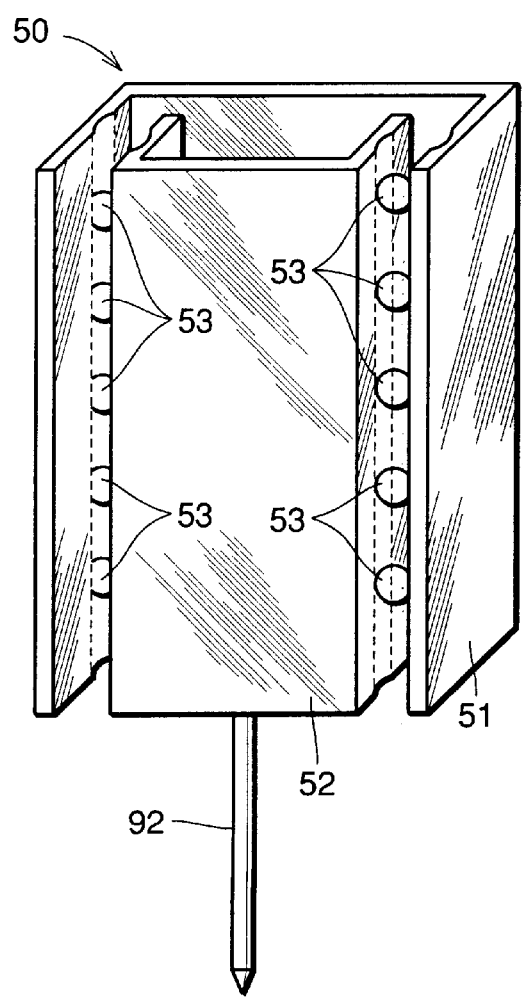
FIG. 19 is a perspective view of a structure of a main portion of an apparatus for repairing a defect according to the invention.

FIG. 19 is a perspective view illustrating a main portion of an apparatus for repairing a detect. Referring to FIG. 19, needle 92 is attached to drive axis 107 of actuator 91 via a slider 50. Other structure is similar to that shown in FIG. 14. Slider 50 includes one guide member 51 fixed at drive axis 107 of actuator 91 and the other guide member 52 at which needle 92 is fixed. One guide member 51 supports the other guide member 52 via a plurality of balls 53 such that the other guide member 52 can move freely up and down. One guide member 51 also prevents the other guide member 52 from dropping by a stopper (not shown).

The amount of driving of actuator 91 when the ink is applied is set such that the tip of needle 92 advances beyond the surface position of the color filter by a prescribed distance. Slider 50 and needle 92 are moved down by actuator 91, needle 92 and the other guide member 52 is stopped when the tip of needle 92 contacts the surface of the color filter, and only one guide member 51 advances the prescribed distance and stops. Accordingly, even if the amount of driving of actuator 91 varies, the tip of needle 92 always experiences the weight of needle 92 and the other guide member 52, so that the force of contact is constant and the state of application of the ink does not change.

Further, needle 92 is supported via balls 53 to avoid an influence such as damping, different from a case in which needle 92 is supported via elastic member such as spring 110. As a result, needle 92 can be supported stably. The tip of needle 92 is thus stabilized and the state of application of the ink is also stabilized.

Figure 20A:
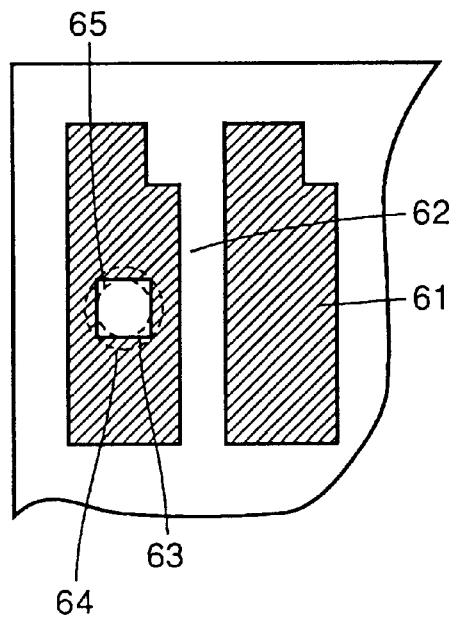
FIGS. 20A and 20B are provided for describing a method of applying ink to a defective portion of a pattern.
Figure 20B:
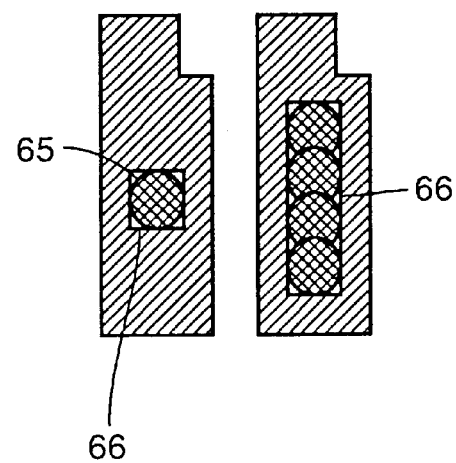

FIGS. 20A and 20B are provided for describing a method of repairing a defect using ink. As shown in FIG. 20A, the shapes of a colored portion 61 and a black matrix portion 62 of a color filter are generally rectangular or a combination of rectangular shapes. Accordingly, a portion to be removed by laser beam 63 is usually shaped into rectangle. A needle for application having a circular horizontal cross section is conventionally used for applying ink to the removed portion, and the portion is repaired as shown by a broken line 64. However, the ink is also applied to the surface of the color filter located around the removed portion resulting in a portion higher than the surface of the color filter and undesirable effect on later processes. In order to prevent this, the ink is desirably applied to the inside of the removed portion as shown by a broken line 65. In this case, as shown in FIG. 20B, a non-colored region 66 is produced at four corners if the removed portion is square, and non-colored region 66 is also produced where there is no layer of ink other than four corners if the removed portion is rectangular.

Figure 21:
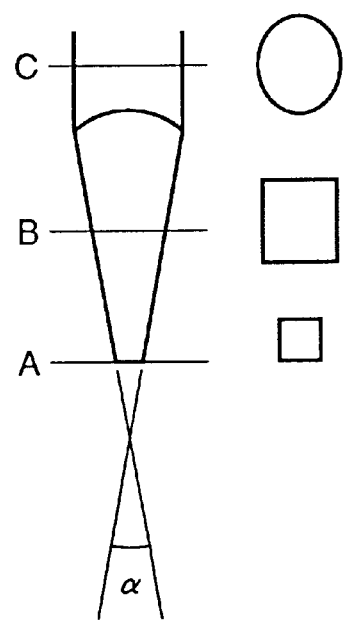
FIG. 21 shows a shape of a leading edge portion of a needle according to the fifth embodiment of the invention.
Figure 22:
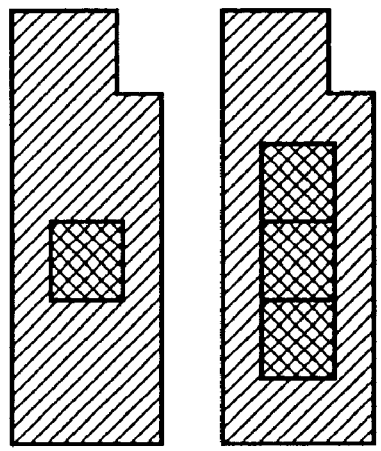
FIG. 22 shows one example of a portion to which ink is applied by the needle shown in FIG. 21.

FIG. 21 shows a shape of a tip of a needle provided for an embodiment by which the problem above is overcome. FIG. 22 shows one example of application of ink by the needle shown in FIG. 21 and FIG. 23 shows a state in which ink is attached to the needle shown in FIG. 21 and a conventional needle.

Referring to FIG. 21, the tip of needle 92 is shaped into taper not to be influenced by the surface tension of the ink. Specifically, the leading end portion of needle 92 is made flat and the cross section thereof is made rectangular as shown by A in FIG. 21. In addition, the shape of the cross section is gradually expanded along the direction of the axis of the needle. The size of the cross section of B is made larger than that of A and the shape of the cross section of C is made circular in FIG. 21. Specific numerical values are selected such that angle α of the taper portion is about 30°, its length is 1–2 mm, and the length of one side of the cross section of the leading end portion is approximately 20 μm.

Figure 23A:
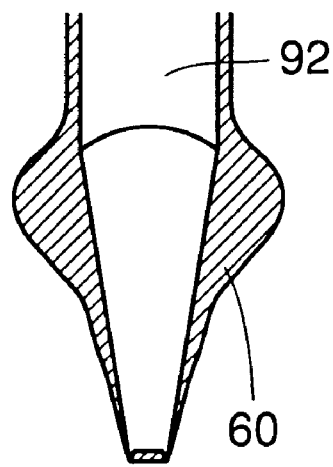
FIGS. 23A and 23B respectively show the needle shown in FIG. 21 and a conventional needle with ink attached.
Figure 23B:
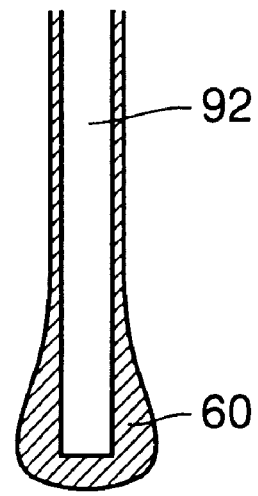

As described above, the shape of the portion to which ink is applied becomes almost rectangular as shown in FIG. 22 since the leading end portion of needle 92 is made flat and rectangular. As a result, non-colored region 66 in FIG. 20B is not generated to enable efficient application of ink. Further, the cross section is shaped to gradually increase. As a result, where ink is attached to the surface of needle 92 when needle 92 is pulled up after immersed into a vessel of ink, accumulation of ink 60 is produced due to surface tension as shown in FIG. 23A. If needle 92 has a taper portion, accumulation of ink 60 is produced at an upper portion of the taper and the leading end portion of needle 92 is exposed. On the other hand, if needle 92 does not have the taper portion, as shown by the linear needle in FIG. 23B, accumulation 60 is produced at the tip portion of the needle, so that the amount of application of ink increases and the shape of the portion to which ink is applied becomes different from the shape of the tip.

Figure 24:
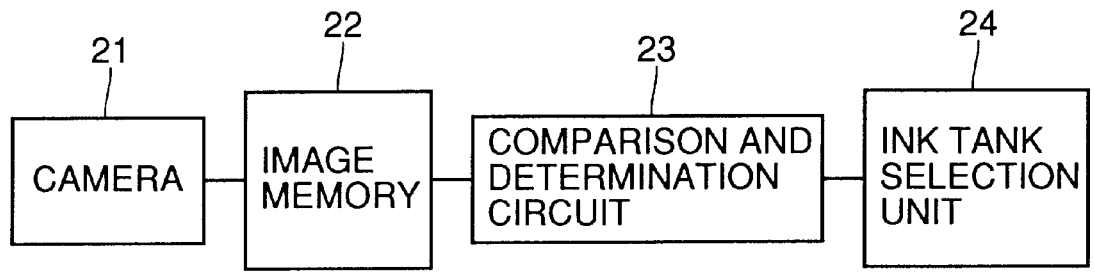
FIG. 24 is a block diagram showing the sixth embodiment of the invention.

FIG. 24 is a block diagram showing an embodiment for determining a color when a defect is repaired according to this invention. Referring to FIG. 24, a camera 21 is used for picking up an image of a pattern of a color filter. Data on the picked up image is stored in an image memory 22. A comparison and determination circuit 23 determines a color of a pixel which has a defect based on the image data stored in image memory 22. An ink tank selection unit 24 selects an ink tank corresponding to a pixel having the color detected, and paint in the selected ink tank is attached to a needle to be applied to the defective portion.

Figure 25:
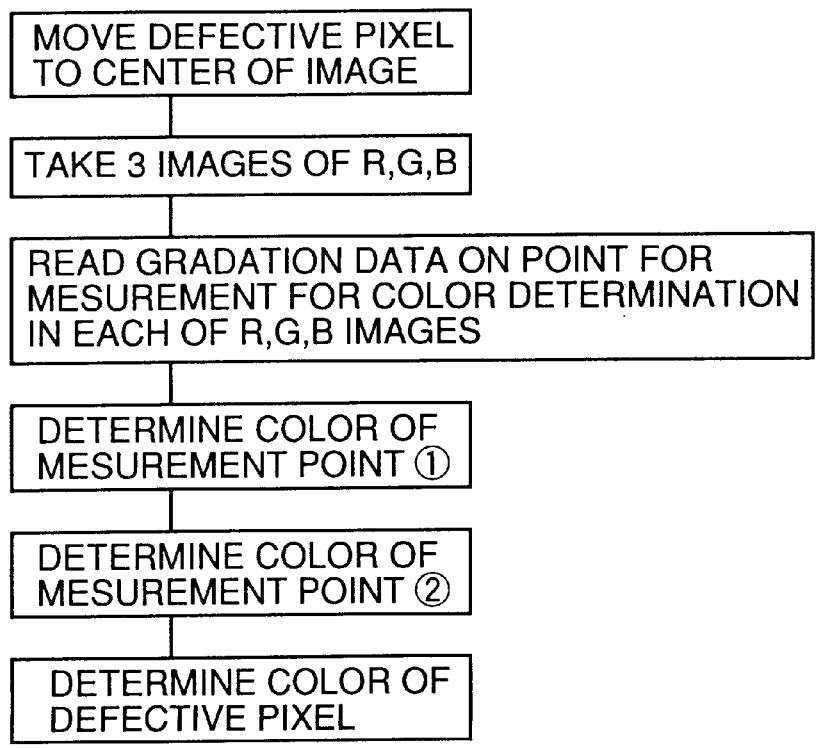
FIG. 25 is a flow chart provided for describing an operation according to the sixth embodiment.
Figure 26:
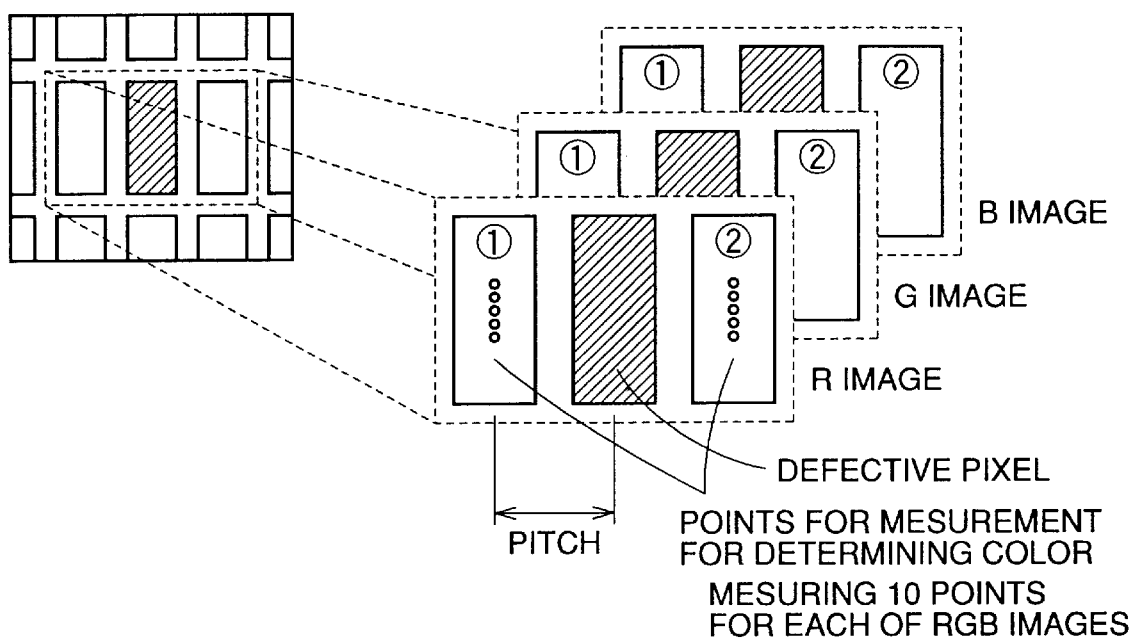
FIG. 26 is provided for describing a method of identifying a color according to the sixth embodiment.

FIG. 25 is a flow chart for describing an operation of determining a color, and FIG. 26 is provided for describing the operation of determining a color.

First a defective pixel is moved to the center of the image plane of camera 21, and images of three pixels of R, G and B are picked up by camera 21. Data on the picked up R, G and B pixels are stored in image memory 22. Comparison and determination circuit 23 reads gradation data at central ten points of the pixels located at both sides of the defective pixel that are points for measuring in order to determine a color of each of three pixels of R, G and B stored in image memory 22. The colors of pixels located at both sides of the defective pixel is thereafter determined. Specifically, comparison and determination circuit 23 compares gradation data on left side pixels ① for respective R, G and B pixels shown in FIG. 26, and determines a color of a signal (R, G, B) having the maximum gradation level as the color of the pixel. The color of a pixel is determined by a similar method for the right side pixel ②. Using the result thereof, one of the colors R, G and B which is not the color of pixels at both sides is determined to be a color of the defective pixel. Using the regularity of the arrangement of colors on the color filter, the color of a defective pixel can be determined by examining the color of a pixel at one side. This is possible if a defective pixel is located at the edge of a substrate. Further, if colors of a color filter are always arranged in the order of R, G, B or the like, the color of a defective pixel can be determined just by examining the color of a pixel at one side because of the regularity.

When the color of the defective pixel is determined as described above, ink tank selection unit 24 selects an ink tank corresponding to the color of the defective pixel and the corresponding color is attached to the needle to repair the defect.

Figure 27A:
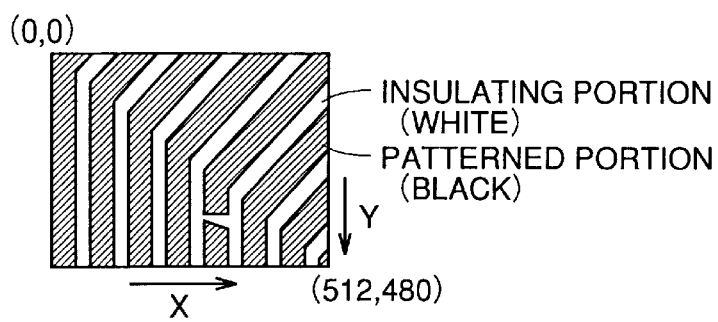
FIGS. 27A–27F are provided for describing a method of repairing a defect according to the seventh embodiment.
Figure 27B:
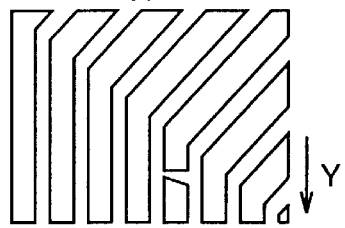

FIGS. 27A–27F provide another embodiment of the invention showing a method of detecting a defect in a continuous pattern carried out by comparison and determination circuit 23 shown in FIG. 24. Referring to FIGS. 27A–27F, inspection is performed based on a characteristic of continuity of a pattern in which a normal pattern is not interrupted within an inspection area. Specifically, an image formed of pixels of 0–512 in X direction and 0–480 in Y direction within the inspection area is taken to be binarized, and image information is stored in image memory 22 as shown in FIG. 27A. Referring to FIG. 27B, if a defect in the stored image is an open defect, a mass of "0" (black pixel) is detected, and if a defect is a short defect, a mass of "1" (white pixel) is detected, and an outline is extracted.

Figure 27C:
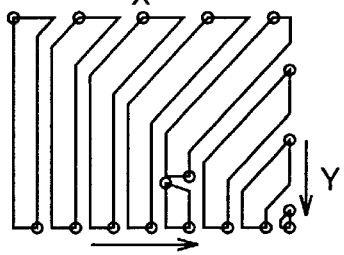
Figure 27D:
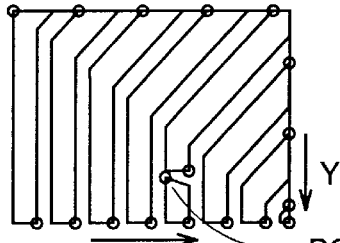

Referring to FIG. 27C, the maximum value and the minimum value of each outline in Y direction are calculated. With reference to FIG. 27D, coordinates of the position having the minimum value of each outline in Y direction are checked. If the position having the minimum value of each outline in Y direction is in contact with the upper, left or right ends of the inspection area, the pattern is determined to be a normal pattern. If the position having the minimum value is not in contact with those, coordinates thereof are stored as those of a position which is expected to be a defect. Although this method is applied to a case in which a pattern continues in vertical direction, if a pattern continues in lateral direction, for example, a defect can be inspected by checking if the position having the minimum value of the outline in X direction is in contact with the left, upper, or lower ends.

Figure 27E:
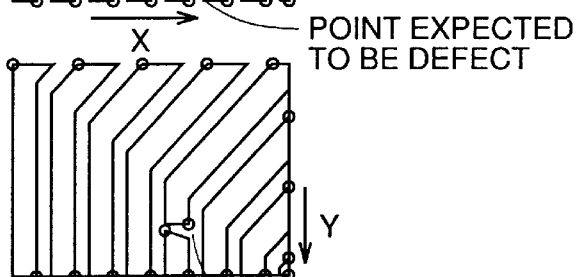
Figure 27F:
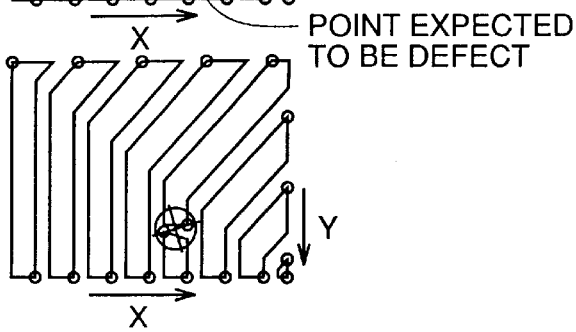

Referring to FIG. 27E, coordinates of the position of the maximum value of each outline in Y direction are checked. If the position of maximum value of each outline in Y direction is in contact with the lower, left, or right ends of the inspection area, the pattern is determined to be a normal pattern. If the position of the maximum value is not in contact with those, the coordinates are stored as coordinates of a position expected to be a defect. Although this method is applied to a case in which a pattern continues in vertical direction, inspection of a defect is similarly possible even if a pattern continues in lateral direction, for example, by checking the position of the maximum value of the outline in X direction for the right, upper and lower ends of the inspection area.

A position of a defect to be repaired is calculated that is actually cut by laser beam or to that paste is applied considering the portion expected to be defective detected as FIGS. 27D and 27E. If the defect is the open defect, the defect is repaired using ink application mechanism 9 shown in FIG. 1. On the other hand, if the defect is the short defect, the short defect is removed by laser irradiation mechanism 5.

Figure 28:
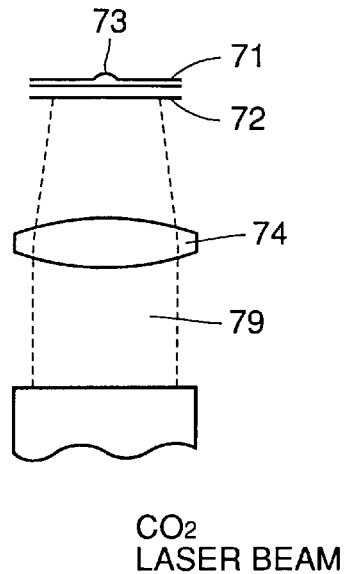
FIG. 28 is provided for describing a method of repairing a liquid crystal substrate according to the eighth embodiment.

FIG. 28 shows the eighth embodiment of the invention provided for describing a method of repairing a liquid crystal substrate. Laser irradiation mechanism 5 shown in FIG. 1 irradiates laser beam from the side of a plane having a pattern to be repaired 71. According to this embodiment, laser beam is irradiated via a collective lens 74 from the side of an opposite plane 72 to calcine paste 73. By irradiating laser beam to a plane formed of only glass, the glass can be heated without reflection of laser beam from the pattern surface such as ITO. As a result, the amount of irradiation of laser beam is not required to be changed according to the shape of the pattern, and optimum calcination of paste is possible under a constant condition of laser irradiation. If the thickness of the glass substrate varies, optimum paste calcination is impossible under the same laser irradiation condition. Further, optimum paste calcination is often impossible due to change of output from the laser due to instability of output from laser.

Figure 29:
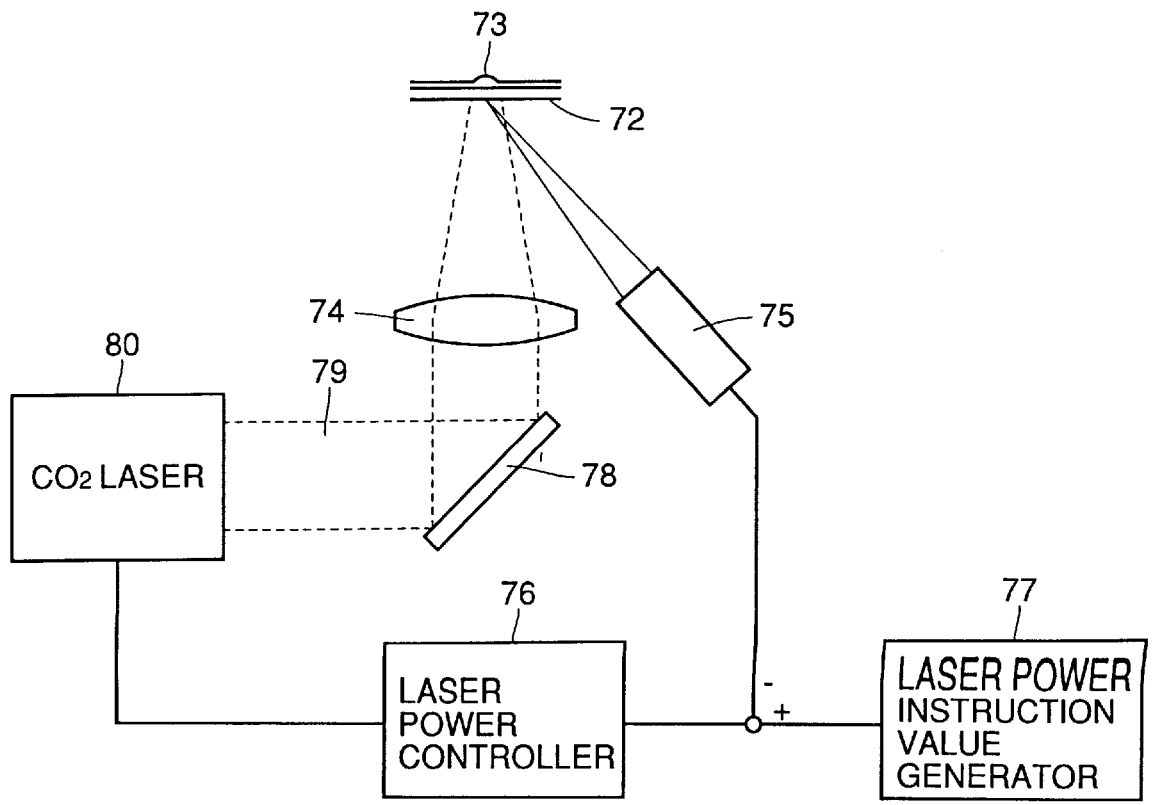
FIG. 29 is a block diagram of an apparatus for repairing a liquid crystal substrate according to the eighth embodiment.

FIG. 29 shows an apparatus for repairing a liquid crystal substrate provided for overcoming such an instability. Referring to FIG. 29, a laser 80 and a radiation thermometer 75 are provided at the side of a non-patterned surface 72. Laser beam 79 emitted from a laser 80 is bent by 90° by a mirror 78 and directed to the side of non-patterned surface 72 via collective lens 74. Radiation thermometer 75 measures the temperature of a glass substrate when laser beam is irradiated thereon. Voltage or current proportional to the measured temperature by radiation thermometer 75 is applied to a laser power controller 76 which controls the power of laser 80. $CO_2$ laser is often utilized as the laser. The reason is that absorptance of the glass substrate for $CO_2$ laser beam is high so that heating of a surface to be repaired including paste is easy. However, the laser is not limited to the $CO_2$ laser and may be a YAG laser or an argon laser.

Figure 30:
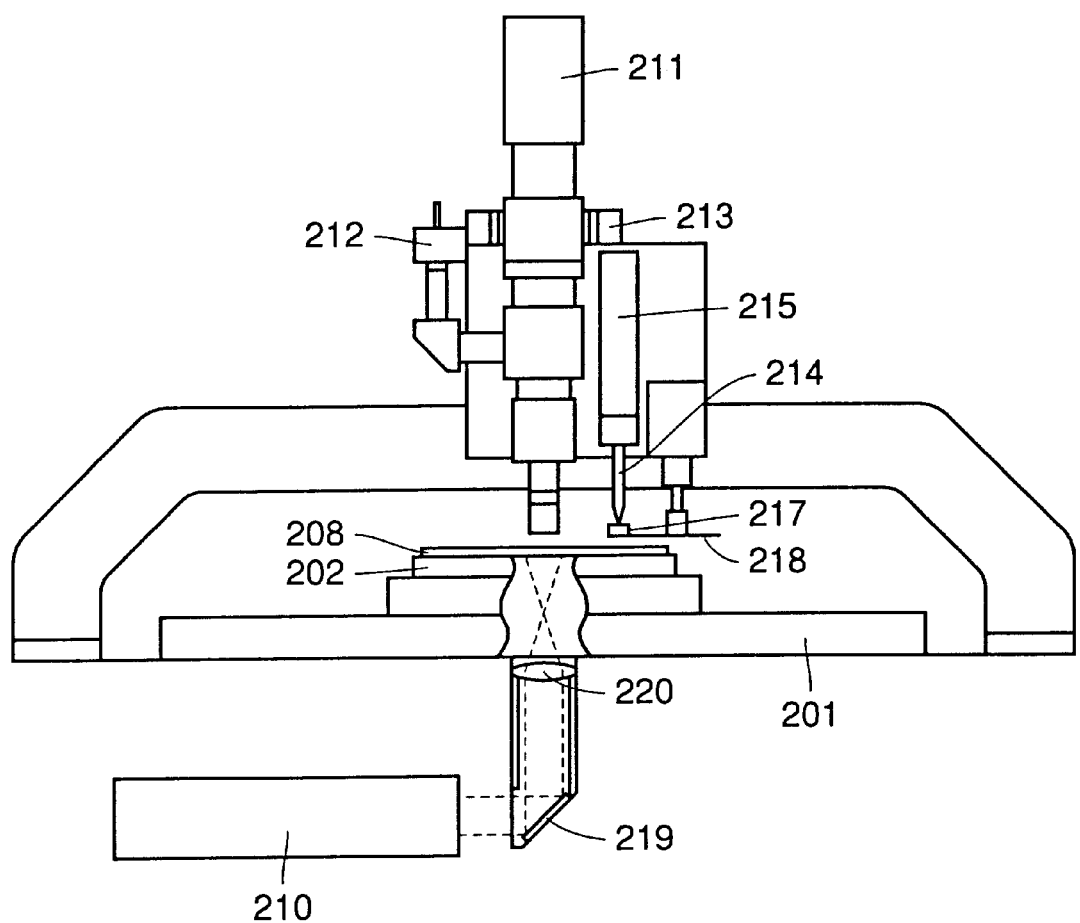
FIG. 30 specifically shows a structure of an apparatus for repairing a liquid crystal substrate.

FIG. 30 shows an entire structure of an apparatus for repairing a liquid crystal substrate including the structure shown in FIG. 29. Referring to FIG. 30, an XY table 201 is placed to freely move in horizontal direction at XY plane. A vacuum chuck table 202 is provided on XY table 201. Vacuum chuck table 202 fixes work 208 having a defect to be repaired at XY table 201. In addition, a Z table 213 moving up and down in Z axis direction is provided. To Z table 213, a YAG laser 211, a CCD camera 212, a needle for applying paste 214, a cylinder 215, a paste tank 217 and rotating table 218 is attached.

YAG laser 211 irradiates laser beam for removing unnecessary portion of the applied paste. CCD camera 212 takes an image of work 208 and needle 214 applies paste for repairing a defective portion. Cylinder 215 moves paste application needle 214 up and down in Z axis direction to attach paste to paste application needle 214. Cylinder 215 is also used when paste is applied to work 208. Paste tank 217 is provided for storing paste, and rotating table 218 moves paste tank 217 to a position directly below paste application needle 214 when paste is attached to paste application needle 214. Z table 213 is employed for adjusting a focus position when the work image is taken by CCD camera 212. Under XY table 201, laser 210 as well as a mirror 219 and a collective lens 220 for irradiating beam from laser 210 onto work 208 are provided. Laser 210 irradiates laser beam for drying or calcinating the paste which is applied to work 208.

According to this embodiment, the source of laser beam is placed at a side opposite to a surface to which conductive paste is applied, and laser beam is irradiated to the conductive paste via the liquid crystal substrate. As a result, an optimum paste calcination is possible under an almost constant laser beam irradiation condition regardless of a pattern of ITO or the like of a portion having a defect to be repaired.

Although the shape of the pattern is described using ITO as one example, it may be PDP, a printed substrate, or a mask substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of repairing a defective portion of a pattern formed on a substrate, comprising the steps of:

magnifying and displaying said defective portion;

removing said defective portion as required; and applying a repairing liquid to said displayed defective portion or said removed portion using a needle having a tapered leading end portion of a length that avoids an influence from surface tension of the repairing liquid and of a cross section that is rectangular.

2. The method of repairing a defective portion according to claim 1, wherein said step of magnifying and displaying includes a step of recognizing said defective portion by image processing.

3. The method of repairing a defective portion according to claim 1, further comprising a step of hardening said applied repairing liquid.

4. The method of repairing a defective portion according to claim 1, further comprising a step of removing an unnecessary portion of said applied repairing liquid by irradiating laser beam to the unnecessary portion altogether.

5. The method of repairing a defective portion according to claim 2, wherein said defective portion is recognized by comparing a defective pattern and a normal pattern using an exclusive OR logic operator.

6. A method of repairing a defective portion of a continuous pattern formed on a substrate, comprising the steps of:

a first step of extracting an outline of said continuous pattern within each inspection area, and calculating the maximum value and the minimum value of said outline in X direction or Y direction to recognize a defective portion of said continuous pattern depending on if those values are respectively in contact with a boundary of said inspection area; and a second step of causing ink or conductive paste attached to a tip of a needle to be in contact with a defective portion and to be applied thereto if said recognized defective portion is a missing portion.

7. A method of repairing a defective portion of a continuous pattern formed on a substrate, comprising the steps of:

a first step of extracting an outline of said continuous pattern within each inspection area, and calculating the maximum value and the minimum value of said outline in X direction or Y direction to recognize a defective portion of said continuous pattern depending on if those values are respectively in contact with a boundary of said inspection area; and a second step of removing, in response to recognition of said defective portion as a short portion by said first step, said short portion by irradiating laser beam onto the short portion.

8. A method of repairing a defect of a pattern formed on a substrate, comprising the steps of:

magnifying and displaying the defect including recognizing said defect by computer-controlled image processing;

removing the defect of the pattern;

applying conductive paste to a removed portion of the pattern; and irradiating laser beam to a surface to be repaired or to a surface not to be repaired of the substrate to calcinate said conductive paste.

9. The method of repairing a defect according to claim 8, further comprising a step of measuring temperature of a portion to be repaired of said substrate to control output of $CO_2$ laser beam based on result of the measurement.

10. An apparatus for repairing a defective portion of a pattern formed on a substrate, said apparatus comprising:

a structure for supporting the substrate;

an image processing means positioned to view said substrate and configured for recognizing a defective portion of a pattern formed on the substrate;

irradiation means for producing a laser beam and directing said beam to said substrate for removing the defective portion detected by the image processing means;

a needle adapted for carrying a repairing liquid and positioned for applying the repairing liquid to the defective portion of the substrate; and a light source which emits light for hardening the repairing liquid applied to the defective portion of the substrate and a lens which collects the light and directs the light onto the defective portion of the substrate.

11. The apparatus for repairing a defective portion according to claim 10, wherein said means for applying a repairing liquid includes a repairing liquid vessel for storing said repairing liquid, a liquid surface detection sensor for detecting a surface of a repairing liquid within said repairing liquid vessel, and means for driving said needle in order to move said needle to the surface of liquid detected by said liquid surface detection sensor.

12. The apparatus for repairing a defective portion according to claim 10, further comprising air jet means for spouting air to said needle to remove anything attached to said needle.

13. The apparatus for repairing a defective portion according to claim 12, further comprising means for cleaning said needle by a cleaning liquid, wherein said air jet means spout air to a needle cleaned by said cleaning means.

14. The apparatus for repairing a defective portion according to claim 13, wherein said cleaning means includes a cleaning liquid vessel storing said cleaning liquid, and means for stirring cleaning liquid within said cleaning liquid vessel, and said driving means being adapted to immerse said needle into said cleaning liquid within said cleaning liquid vessel to clean said needle.

15. The apparatus for repairing a defective portion according to claim 14, wherein said driving means includes a movable member to which an upper end portion of said needle is fixed, and a support member connected to said structure which supports said movable member such that it moves freely up and down with pressure of contact between a tip of said needle and the substrate kept contact when the tip of said needle is pressed against the substrate.

16. The apparatus for repairing a defective portion according to claim 15, wherein said support member supports said movable member via an elastic member such that said movable member can freely move up and down.

17. The apparatus for repairing a defective portion according to claim 16, wherein said support member supports said movable member via a ball bearing such that said movable member can move freely up and down.

18. The apparatus for repairing a defective portion according to claim 10, wherein said light source of said hardening means functions as, a light source for recognizing a shape of a slit.

19. The apparatus for repairing a defective portion according to claim 10, wherein said means for irradiating laser beam is YAG laser which emits wavelength ranging from fundamental wave to harmonic according to material of said defective portion.

20. The apparatus for repairing a defective portion according to claim 10, wherein a leading end portion of said needle is made flat and shaped into taper having a length which avoids an influence from surface tension of- said repairing liquid.

21. The apparatus for repairing a defective portion according to claim 20, wherein a cross section of said leading end portion of said needle is shaped into a rectangle.

22. The apparatus for repairing a defective portion according to claim 10, wherein said image processing means includes
means for picking up an image of said pattern, and
determining means connected to said pick up, means for taking gradation data on each color signal of each image based on data on the image picked up by said picking up means to determine information of the highest gradation as a color of a pixel.

23. The apparatus for repairing a defective portion according to claim 22, wherein said determining means determines a color of a pixel including a defect using colors of pixels at both sides or a color of a pixel at one side and includes
means for selecting a repairing liquid of a color of a pixel determined by said determining means.

24. An apparatus for repairing a defective portion of a continuous pattern formed on a substrate, comprising image processing means for extracting an outline of said continuous pattern within each inspection area, and calculating the maximum value and the minimum value of said outline in X direction or Y direction to recognize a defective portion of said continuous pattern depending on if those values are respectively in contact with a border of said inspection area; and ink application means controlled by said image processing means for causing ink or conductive paste attached to a tip of a needle to be in contact with a defective portion and to be applied thereto, if the defective portion recognized by said image processing means is a missing portion.

25. An apparatus for repairing a defective portion of a continuous pattern formed on a substrate, comprising:

a structure for supporting the substrate;

image processing means positioned to view the substrate and configured for extracting an outline of said continuous pattern within each inspection area, and calculating the maximum value and the minimum value of said outline in X direction or Y direction to recognize a defective portion of said continuous pattern depending on if those values are respectively in contact with a border of said inspection area; and laser irradiation means controlled by said image processing means, and adapted for removing, if a defective portion is recognized to be a short portion by said image processing means, said short portion by irradiating laser beam thereto.

26. The apparatus for repairing a defective portion according to claim 25, further comprising:

XY movement means connected to said structure for adjusting a position of a defect of said continuous pattern with respect to a position of said laser irradiation means; and Z movement means connected to said structure for adjusting said laser irradiation means in a direction of a height above said receiving portion.

27. An apparatus for repairing a defective portion of a pattern formed on a substrate, comprising:

a table for supporting the substrate, the table being movable in a horizontal direction;

an image processing means positioned to view said substrate and configured for recognizing a defective portion of a pattern formed on the substrate;

a needle for applying conductive paste to the defective portion located at one surface of the pattern of the substrate;

a drive mechanism which is configured to move said needle up and down with respect to the table; and a laser beam source configured for calcinating said conductive paste via the substrate.

28. The apparatus for repairing a defective portion according to claim 27, further comprising:

a radiation thermometer for measuring temperature of a portion to be repaired when laser beam is irradiated from said laser beam source to the portion to be repaired of the substrate; and means for controlling output from said laser beam source based on output received by said controlling means from said radiation thermometer.

* * * * *